(12) United States Patent
Shabde et al.

(10) Patent No.: US 6,320,403 B1
(45) Date of Patent: Nov. 20, 2001

(54) METHOD OF DETERMINING THE DOPING CONCENTRATION AND DEFECT PROFILE ACROSS A SURFACE OF A PROCESSED SEMICONDUCTOR MATERIAL

(75) Inventors: Sunil N. Shabde, Cupertino; Yowjuang William Liu, San Jose; Ting Yiu Tsui, Palo Alto, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/131,588

(22) Filed: Aug. 10, 1998

(51) Int. Cl.$^7$ .............................. G01R 31/02; G01R 31/26
(52) U.S. Cl. ........................... 324/766; 324/765; 324/762
(58) Field of Search ..................... 324/766, 765, 324/762, 158.1, 719, 758, 724, 252

(56) References Cited

U.S. PATENT DOCUMENTS

| | | |
|---|---|---|
| 4,700,211 * | 10/1987 | Popvic et al. ................. 324/252 |
| 4,706,015 | 11/1987 | Chen . |
| 4,803,435 | 2/1989 | Mills . |
| 4,816,755 | 3/1989 | Look et al. . |
| 5,021,364 * | 6/1991 | Akamine et al. ................ 324/762 |
| 5,214,389 * | 5/1993 | Cao et al. ..................... 324/758 |
| 5,323,050 * | 6/1994 | Ristic ......................... 324/252 |
| 5,393,678 * | 2/1995 | Ristic ......................... 324/252 |
| 5,420,796 | 5/1995 | Weling et al. . |
| 5,426,302 | 6/1995 | Marchman et al. . |
| 5,442,221 | 8/1995 | Mosser et al. . |
| 5,489,774 | 2/1996 | Akamine et al. . |
| 5,517,027 | 5/1996 | Nakagawa et al. . |
| 5,517,128 * | 5/1996 | Henninger ..................... 324/765 |
| 5,517,170 | 5/1996 | Peters et al. . |
| 5,520,769 | 5/1996 | Barrett et al. . |
| 5,528,067 | 6/1996 | Farb . |
| 5,543,988 | 8/1996 | Brady et al. . |
| 5,652,151 | 7/1997 | Asada . |
| 5,652,445 * | 7/1997 | Johnson ....................... 324/252 |
| 5,668,395 | 9/1997 | Razeghi . |
| 5,710,052 | 1/1998 | Alvis et al. . |
| 5,723,981 * | 3/1998 | Hellemans et al. .............. 324/756 |
| 5,833,518 * | 3/1999 | Borden ........................ 324/765 |
| 5,966,019 * | 10/1999 | Borden ........................ 324/765 |

* cited by examiner

Primary Examiner—Safet Metjahic
Assistant Examiner—Jermele M. Hollington
(74) Attorney, Agent, or Firm—Eschweiler & Associates, LLC

(57) ABSTRACT

A method (100) of determining a doping type and a doping concentration of a semiconductor material (101) includes the steps of moving carriers (103) in the material, wherein a number of carriers is a function of the doping concentration of the material (101) and a type of carriers is a function of the doping type of the material (101). The carriers are deflected (130) toward a surface (110) of the material (101) and an accumulated charge profile on the surface of the material, due to the deflected carriers, is detected (140) and used to calculate (180) the doping concentration across a surface (110) of the material (101).

15 Claims, 7 Drawing Sheets

METHOD OF DETERMINING THE DOPING CONCENTRATION AND DEFECT PROFILE ACROSS A SURFACE OF A PROCESSED SEMICONDUCTOR MATERIAL

FIELD OF THE INVENTION

The present invention generally relates to a method of determining a doping type and a doping concentration for a processed semiconductor material, and more particularly relates to a method of scanning a semiconductor wafer and mapping a doping concentration across the wafer surface using the Hall effect.

BACKGROUND OF THE INVENTION

The geometry of various components within semiconductor devices are important to the performance of such devices. For example, ultra-shallow source/drain regions are desired and a MOS transistor transconductance relies upon the width-to-length ratio (W/L) of the device. In addition to the importance of the device geometries, the doping concentration within the regions (i.e., the doping concentration profiles) are relevant to the performance of the device.

In light of the above concerns regarding the geometry and doping concentrations of regions within semiconductor structures, various methods exist and are used to determine the junction depths and doping concentration of various regions to thereby monitor the semiconductor process. The various methods include sheet resistance measurements, junction depth measurements and doping profile measurements.

A four-point probe technique is used to measure the sheet resistance Rs of a film or doped region. The sheet resistance Rs of a film (which in this instance is the wafer) is determined as follows in conjunction with prior art FIG. 1. The resistance (R) of a rectangular shaped film of length (L), width (W) and thickness (t) is given by the equation:

$$R = \rho L/tW,$$

wherein $\rho$ equals the resistivity of the film, which is unique for a given material, and is measured in $\Omega$-cm. If the length L is equal to the width W, then the rectangle is a square and the equation reduces to:

$$R = \rho/t = Rs,$$

wherein Rs is the sheet resistance in $\Omega$/square and is independent of the size of the square (but does depend on the resistivity of the material and the thickness of the film). Therefore the resistivity $\rho$ and the sheet resistance Rs are distinct parameters that are related by the above equation.

The four-point probe method is illustrated in prior art FIG. 2. If the sample film may be approximated as semi-infinite with respect to the spacings (s) between the four probes (which are spaced apart substantially equally from one another), the current (I) is driven as shown and the voltage drop ($V_1-V_2$) is measured across the remaining probes as illustrated in prior art FIG. 2. The sheet resistance may then be calculated according to the following equation:

$$Rs = (V_1-V_2)(2 \pi s)/It.$$

To prevent erroneous readings using the four point technique (e.g., due to thermoelectric heating and cooling) the measurement is often performed with current forced in both directions and the two readings are averaged. Further, the test is often performed at several current levels (i.e., $I_1$, $I_2$, etc.), until the proper current level is found. For example, if the current is too low, the forward and reverse current readings will substantially differ and if the current is too high, $I^2R$ heating will result in the measured reading drifting over time. Although the American Society for Testing and Materials (ASTM) provides standards which recommend current levels for a given resistivity range, one may still need to vary the current about the recommended value to achieve the optimum current for an accurate measurement which undesirably takes extra time.

The sheet resistance Rs and the resistivity $\rho$ are found using the measured results and the equation V/I(2 $\pi$s), wherein s is the probe spacing. The above equation, however, is only accurate if the sample is semi-infinite with respect to the probe spacings, which is often not an accurate assumption. Thus, the sheet resistance is typically calculated by the relation:

$$Rs = (V/I)F_1,$$

wherein $F_1$ is a correction factor which is a function of the average probe distance s and the wafer diameter D (i.e., $F_1 = f(s/D)$). Since the four-point probe technique uses a correction factor and occupies a space of at least 3s due to the four probes, the readings are not totally accurate and further represent merely an average resistivity within the region of 3s.

Several prior art methods are used to measure a junction depth ($x_j$) of various regions such as source/drain regions, n-wells, p-wells, etc. These prior art methods include, for example: (1) angle-lap and stain, (2) groove and stain, and (3) transmission electron microscopy (TEM). The angle-lap and stain method involves grinding a wafer to form an angle or beveled surface at an angle $\theta$ as illustrated in prior art FIG. 3 using, for example, a slurry having a lapping compound. After grinding the wafer, a staining solution is used to delineate the n-type and p-type areas. The staining solution includes, for example, copper sulphate ($CuSO_4$) and the stained region is then subjected to an intense light source which causes the stained junction to become forward biased. The copper atoms then plate onto the n-type region which thereby delineates the regions and allows a lateral measurement (x) of the stained region, as illustrated in FIG. 3. The junction depth ($x_j$) is then measured according to the formula:

$$x_j = x \tan \theta.$$

The angle-lap and stain method, however, suffers from problems because large sources of error may occur from uncertainty of the lapping angle. This is usually addressed by subsequently measuring the formed lapping angle using a laser reflection system which undesirably increases the complexity and cost of the measurement. Another problem with the angle-lap and stain method is that if the $CuSO_4$ concentration is too high, excessive copper plating occurs which results in poor junction delineation. In addition, if the concentration is too low, little plating will occur, especially on lightly doped n-type regions.

The groove and stain method uses a rotating ball or cylinder having, for example, a diamond grit which contacts the wafer and cuts a groove in the silicon which is sufficiently deep to expose the junction to be measured, as illustrated in prior art FIG. 4. After the groove is formed, it is stained in a manner similar to that discussed supra and measurements (e.g., x and y of FIG. 4) are taken, and the junction depth ($x_j$) is determined according to the following formula:

$$x_j=xy/2R,$$

wherein R is the radius of the arc formed by the rotating ball or cylinder. The groove and stain method suffers the same staining limitations as discussed above with respect to the angle-lap and stain procedure. In addition, the groove and stain method suffers from errors due to the groove not being exactly cylindrical and also from difficulties in determining the edge of the groove (for measuring x and y of FIG. 4) when viewed under a microscope.

Another method of measuring the junction depth involves transmission electron microscopy (TEM). The TEM method involves applying a wet etch type solution such as 0.5% HF in $HNO_3$ to selectively remove the n-type material and subsequently analyzing the etched result using the TEM to measure the junction depth ($x_j$). TEM, however, requires a significant amount of work to properly prepare the sample, including ion milling, etc. which makes implementation of TEM burdensome.

As discussed above, each of the above junction depth measurements has limitations. In addition, each of the above test procedures is destructive and cannot be performed in-line (i.e., within the semiconductor manufacturing process) and is thus undesirable.

Several prior art doping concentration profile measurement methods exist, including: (1) the capacitance-voltage (C-V) technique, (2) spreading resistance measurements, and (3) secondary ion mass spectroscopy (SIMS). The capacitance voltage technique is based on the reverse biased capacitance of a p-n junction. The technique requires the formation of a shallow p+ or n+ region over the surface of the region of interest to generate the p-n junction and the capacitance is measured while varying a reverse bias voltage. The doping concentration "n" is then determined according to the following equation:

$$C(V)=(q\epsilon_s n/2)^{1/2}[V_{bi} \pm V_R-(2kT/q)^{1/2}$$

wherein $\epsilon_s$ is the permittivity of silicon, $V_{bi}$ is the built-in potential of the junction and $V_R$ is the reverse bias voltage. The depth at which the concentration "n" is measured is obtained from the value of the reverse bias voltage $V_R$. The capacitance-voltage technique is limited for extremely shallow junctions since the technique is unable to determine the concentration at the surface (within the zero bias depletion region) and also has difficulty measuring abrupt profiles.

The spreading resistance measurement utilizes the spreading resistance (i.e., the resistance associated with the divergence of current when a probe is placed on the doped region). To make the spreading resistance measurement, a known current is applied between the two probes and the voltage drop is measured across the probes ($R_{SR}=V/I$). The value of the measured spreading resistance is related to the resistivity by the following:

$$\rho=2R_{SR}a,$$

wherein "a" is an empirical value which is related to the probes taking the measurement. The spreading resistance technique is then used to determine the doping concentration by angle lapping the processed wafer as discussed above and making spreading resistance measurements along the length of the angle. Because the angle of the cut (or ground) wafer is known, the depth may be easily determined by using the distance between the probe and the edge of the wafer. The spreading resistance technique suffers from the same limitations as the angle-lap and stain technique since extra work must be performed to accurately determine the angle for subsequent measurements.

Secondary ion mass spectroscopy (SIMS) is another method used to measure doping profiles. SIMS involves bombarding the processed wafer with atoms (e.g., oxygen atoms) which collide with atoms on the surface which cause the atoms to be ejected from the surface (i.e., sputtering). During the energy transfer process, a small fraction of the ejected atoms leave as either positively or negatively charged ions which are collected by the mass spectrometer. The ion yield of the wafer is measured and a linear dependence between the ion yield and the doping concentration is used to determine the profile. Again, since the processed wafer is sputtered, the test is destructive and cannot be performed in-line.

In light of the above limitations in the prior art, it would be desirable to have a method of determining the doping type and the doping concentration of a processed semiconductor wafer that provides a more accurate and convenient resistivity reading without destroying the region being tested.

SUMMARY OF THE INVENTION

The present invention relates to a method of mapping the doping type and the doping concentration across the surface of a processed semiconductor wafer. The method includes moving carriers in the doped semiconductor wafer and subjecting the carriers to a magnetic field. The magnetic field deflects the carriers in the doped material toward the wafer surface according to the Hall effect. The charge polarity and the number of carriers deflected to the wafer surface relates to the doping type and the doping concentration, respectively, at each point in the wafer, thereby resulting in a charge accumulation profile at the wafer surface. The charge accumulation profile is detected and used to calculate the doping type and the doping concentration at each point on the wafer surface, thereby resulting in a doping type and doping concentration mapping of various doped regions across the wafer in a non-destructive manner.

According to one aspect of the present invention, the method includes placing two probes on the surface of the processed wafer to be evaluated. A current is forced through the two probes using a current source (i.e., moves charge carriers). The processed wafer is subjected to a magnetic field which is oriented perpendicular to the current path and, according to physical principles characterized as the Hall effect, the magnetic field exerts a force on the carriers in the wafer, thereby deflecting the carriers toward the wafer surface. The charge polarity and the number of carriers deflected at each point within the wafer is a function of the doping type and the doping concentration at that point, wherein the greater the doping concentration, the greater the number of carriers. The deflected carriers reach the wafer surface and form a charge accumulation profile at the wafer surface which reflects the doping type and the doping concentration in the wafer. The charge accumulation profile is then scanned using a charge detection device such as an atomic force microscope and the profile is used to calculate the doping concentration at each point across the wafer.

According to another aspect of the present invention, a method for detecting defects is provided. The presence of defects in the doped semiconductor reduces the number of carriers at or near that location in the wafer. Thus, when carriers are activated and deflected toward the surface of the wafer, the accumulated charge profile may appear discontinuous, thus highlighting the location of defects in the wafer.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
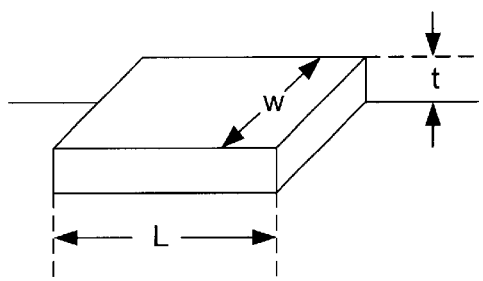
FIG. 1 is a prior art perspective view of a conductive film used for illustrating the principle of a film's sheet resistance.
Figure 2:
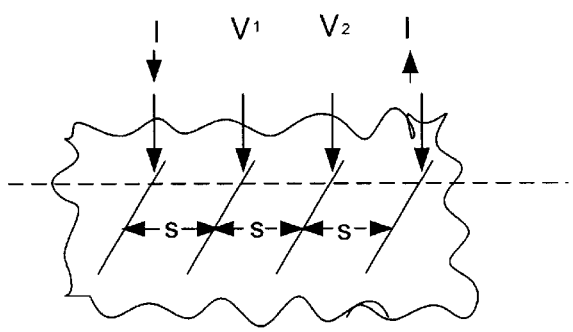
FIG. 2 is a prior art fragmentary perspective view illustrating a four-point probe technique for measuring a sheet resistance of a film.
Figure 3:
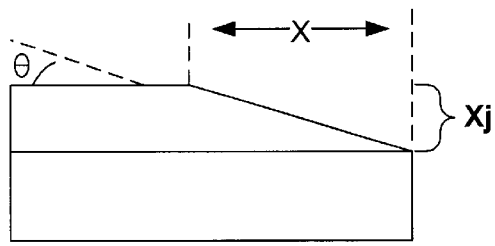
FIG. 3 is a prior art fragmentary cross section diagram illustrating the measuring of a junction depth according to the angle-lap and stain method.
Figure 4:
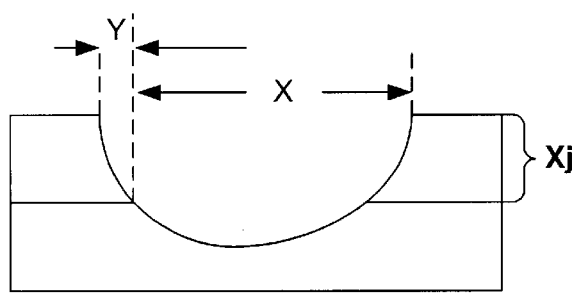
FIG. 4 is a prior art fragmentary cross section diagram illustrating the measuring of a junction depth according to the groove and stain method.

The following is a detailed description of the present invention made in conjunction with the attached Figures, wherein like reference numerals will refer to like elements throughout. The present invention relates to a method of determining the doping type and the doping concentration of a processed semiconductor material. The method includes moving carriers in the material, wherein the type and the number of the carriers is a function of the doping type and the doping concentration of the material. The moving carriers are then deflected toward the surface of the material to form an accumulated charge profile on the material surface which is detected using a charge detector. The charge profile depends on the type and the number of deflected carriers and thus reflects the doping type and the doping concentration across the semiconductor material.

In one embodiment of the present invention, the carriers are moved by forcing a current through the wafer using probes. The probes make contact with the wafer surface and are connected to a current source which generates a potential difference between the probes. The carriers are then preferably deflected using the Hall effect by subjecting the wafer to a magnetic field which is perpendicular to the direction of current flow. The magnetic field exerts a force on the carriers which deflects the carriers toward the wafer surface, thus creating a charge accumulation profile at the wafer surface. The accumulated charge is then detected by a charge or voltage probe such as an atomic force microscope and used to calculate the doping type and the doping concentration at each point on the surface of the wafer.

In yet another embodiment of the present invention, the detected charge accumulation profiles are utilized to determine the location of defects within the processed semiconductor material. Since defects decrease the number of available charge carriers at or near the defect location, the defect results in a discontinuity in the expected continuous charge accumulation profile. Thus the charge accumulation profile may be analyzed and used to determine the location of defects within doped regions.

Figure 5:
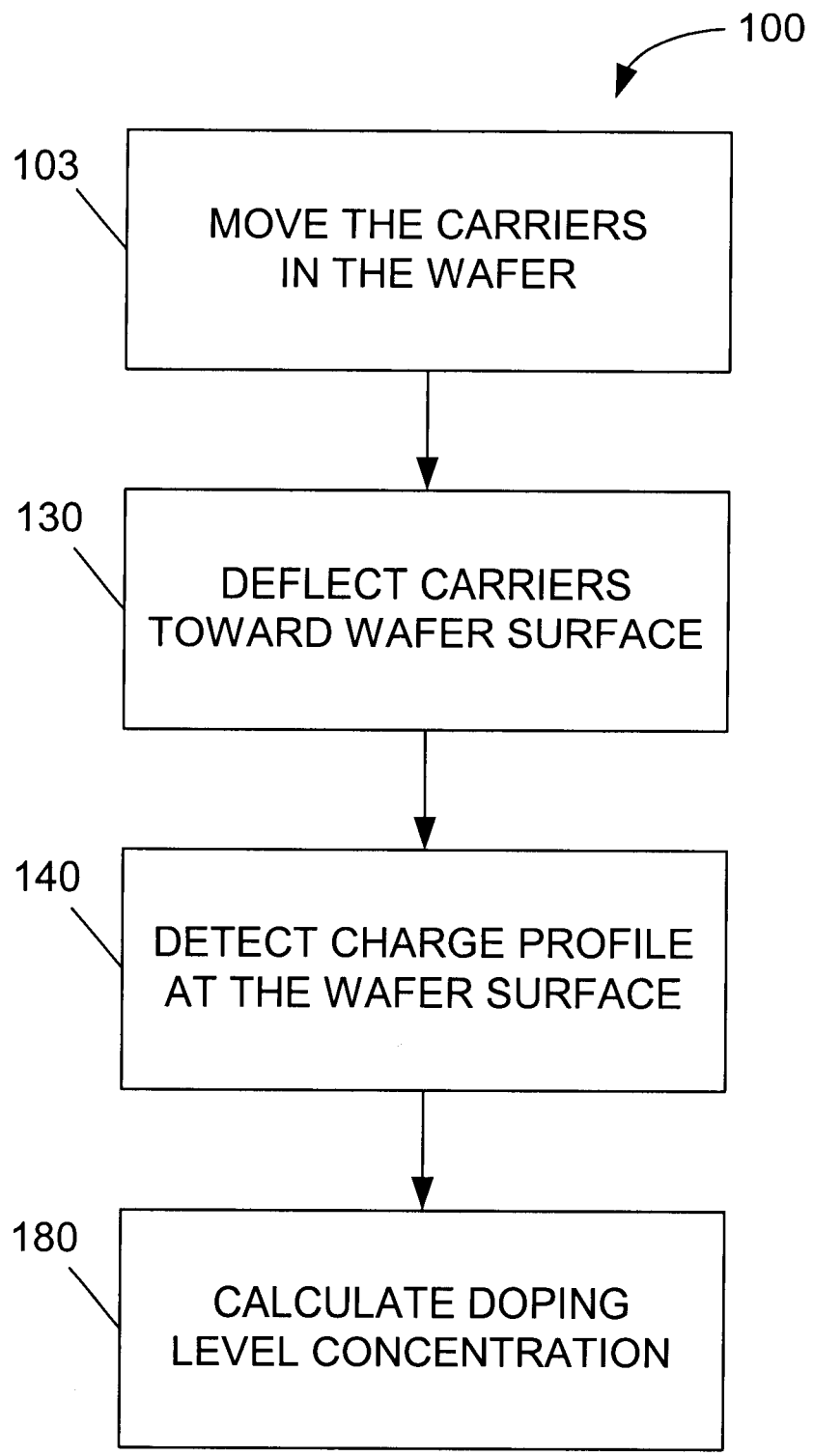
FIG. 5 is a flow chart illustrating a method of determining the doping type and the doping concentration of a processed semiconductor material across the material surface according to the present invention.
Figure 6:
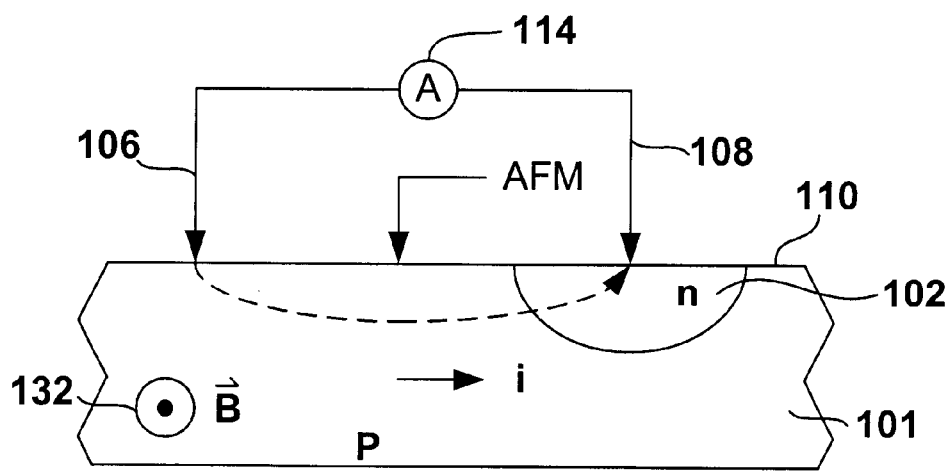
FIG. 6 is a fragmentary cross section diagram illustrating a doped semiconductor wafer having a current conducting therethrough via probes on the wafer surface and a charge detector device on the wafer surface according to the present invention.

Turning now to the Figures, FIG. 5 is a flow chart representing a method 100 for determining the doping type and the doping concentration of a semiconductor material. According to a preferred embodiment of the present invention, the semiconductor material is a lightly doped p-type semiconductor wafer 101 having an n-type region 102 formed therein, as illustrated in FIG. 6. FIG. 6, however, is merely a representation used for clearly illustrating the present invention. It should be understood that the method of the present invention is also applicable to any type of processed semiconductor material and any such material is contemplated as falling within the scope of the present invention.

Figure 7:
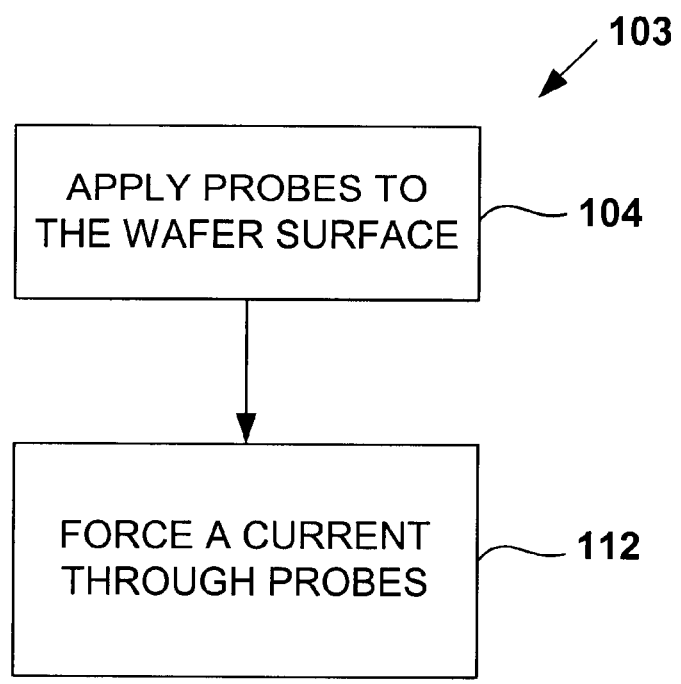
FIG. 7 is a flow chart illustrating a step of moving carriers in the material according to the present invention.

At step 103 of the method 100, carriers are moved in the wafer. The moving of carriers in the wafer may be accomplished through a variety of means, as is well known by those skilled in the art. Preferably, the carriers are moved in the wafer at step 103 by forcing a current through the wafer, as illustrated in the flow chart of FIG. 7. Forcing a current begins at step 104 and includes applying probes 106 and 108 to a wafer surface 110, as illustrated in FIG. 6. A current is then forced through the probes at step 112 using, for example, a current source 114, as illustrated in FIG. 6.

Figure 8A:
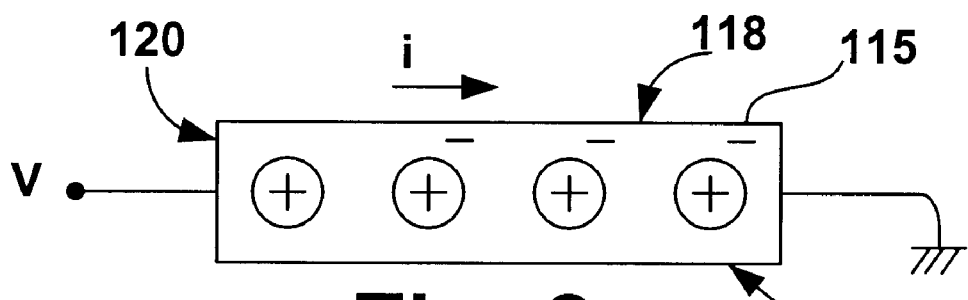
FIGS. 8a–8d are cross section diagrams of a doped semiconductor material illustrating charge carrier transport through a portion of the processed semiconductor material according to the present invention.
Figure 8B:
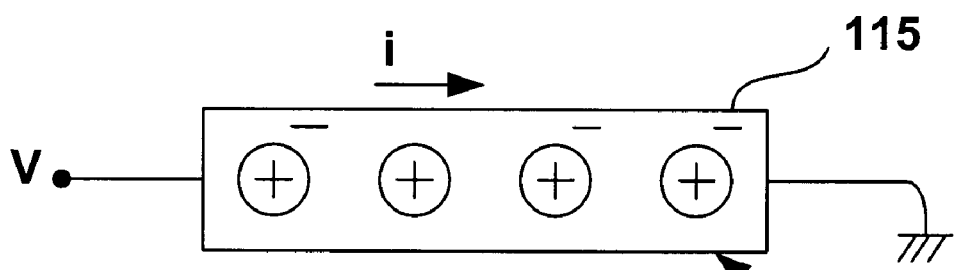
Figure 8C:
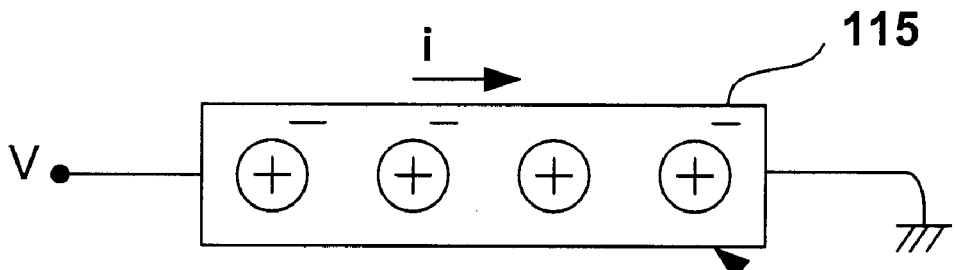
Figure 8D:
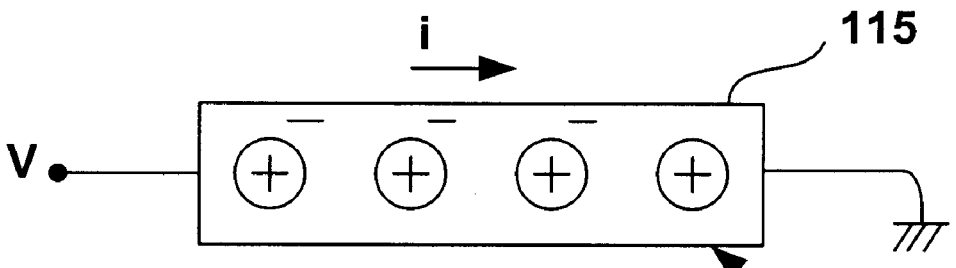

A current (i) flows through the substrate 101 and the region 102. The current (i) through the wafer is effectuated by carrier transport, as is well known by those skilled in the art. An exemplary model of carrier transport is illustrated in FIGS. 8a–8d. In FIG. 8a, a p-type semiconductor material 115 such as silicon includes a plurality of positively charge ions 116 (in a p-doped material, an excess of positively charged ions exist compared to the number of free electrons in the material). The p-type material 115 also includes free electrons 118 that join with the positive ions 116 to provide an electrically neutral atom. When a voltage (V) is supplied across the material 115, an electron 118 is pulled out at the left end 120 of the material 115, leaving the array of atoms with a "hole" (i.e., a missing electron which is sometime called a vacancy), as illustrated in FIG. 8a. The electrons 118 then incrementally shift to the left to fill the hole in sequence, as illustrated in FIGS. 8a–8d, thus resulting in the "hole" (i.e., the carrier) moving through the material 115. The collective motion of the electrons from right to left can thus be characterized as the motion of a "hole" from left to right. As can be seen from FIGS. 8a–8d, the number of carriers is a function of the doping level concentration in the material 115. This relation may then be used to help determine the doping level concentration in the material 115.

Similarly, the same principles may be used to characterize carrier transport in n-type doped semiconductor materials. In such a case, the material has an excess of free electrons (as opposed to an excess of positively charged ions) and current is provided through the transport of negative carriers (i.e., the electrons). In any case, once the carriers have been moved at step 103, the carriers are then deflected toward the wafer surface 110 at step 130 of FIG. 5.

According to a preferred embodiment of the invention, the carrier deflection is accomplished by subjecting the wafer to a magnetic field 132, as illustrated in FIG. 6. The magnetic field 132 is oriented in a direction perpendicular to the direction of current flow and deflects the carriers toward the wafer surface 110 in accordance with the Hall effect which will now be discussed and explained in conjunction with FIG. 9.

Figure 9:
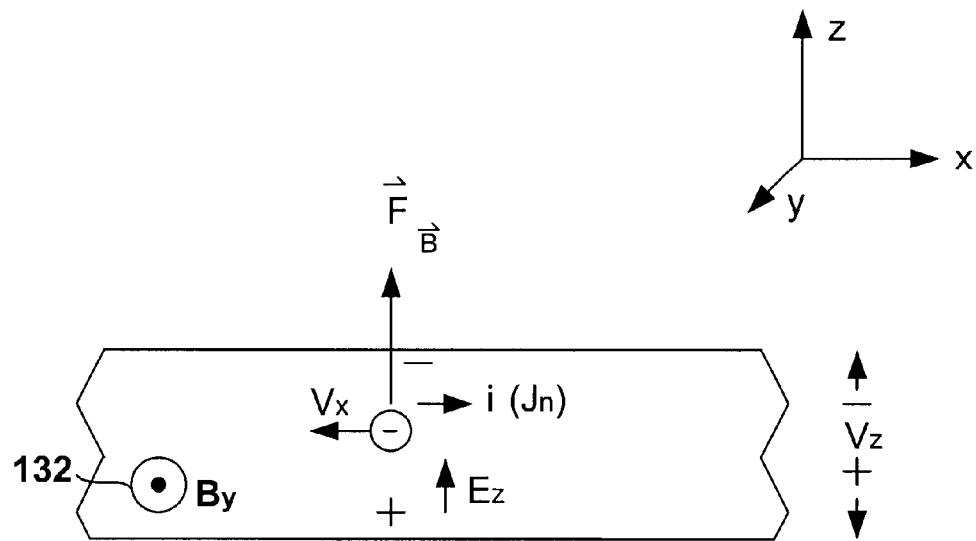
FIG. 9 is a fragmentary cross section diagram illustrating the Hall effect and how a charged particle traveling through a material in the presence of a magnetic field which is perpendicular to the current exerts a force on the charged particle.

The force exerted on a particle in the presence of an electric and magnetic field is called the Lorentz force and is represented by:

$$F=q(E+v \times B),$$

wherein E is the electric field vector, B is the magnetic field vector and v is the particle velocity vector (which in the case of the present invention is in a direction opposite to the direction of current flow). As can be seen by the above equation, the force exerted by the magnetic field component is in a direction perpendicular to the flow of current if the magnetic field is oriented in a direction perpendicular to the direction of current flow since the magnetic force component ($qv \times B$) is determined by the "curl" of the velocity vector and the magnetic field vector. As illustrated in FIG. 9, if the current (i) is in the positive "x" direction (and thus the velocity vector is in the negative "x" direction) and the magnetic field is directed perpendicularly out of the page, then, according to the "right hand rule", the force exerted on the particle due to the magnetic field will be in the positive "z" direction, thus deflecting the particle toward the wafer surface 110, as illustrated in FIG. 9.

The Hall effect employs this particle deflection principle. In general, the Hall effect can be summarized as follows: a conductive material having a current flowing in the presence of a perpendicular magnetic field will result in a potential difference developing across the conductor. This can be easily seen in FIG. 9. When the magnetic field 132 deflects a carrier (whether positive or negative) towards the wafer surface 110, an accumulation of charge develops at that point on the wafer surface 110 which is proportional to the number of carriers in the wafer at that point. The accumulation of charge thus results in the development of a voltage potential ($V_z$) across the wafer, which is referred to as the Hall voltage. The present invention utilizes the Hall effect to determine both the doping type and the doping concentration since the Hall voltage will have a polarity that indicates the doping type (e.g., p-type or n-type) and an amplitude which is proportional to the doping concentration.

Once the carriers have been deflected toward the surface at step 130, thus causing a charge accumulation profile to form on the wafer surface 110, the charge profile is detected at step 140 of FIG. 5. In one exemplary embodiment of the present invention, the charge profile can be detected using a voltage probe, a voltage meter or the like. Preferably, however, the charge profile is detected using an atomic force microscope (AFM) such as a Dimension™ 5000 Scanning Probe Microscope manufactured by Digital Instruments using the electric force microscopy (EFM) option feature with an Extender Electronics Module. Using an AFM for detecting the charge profile is preferred because the tip is extremely small which allows for an extremely high resolution charge profile to be detected.

Figure 10:
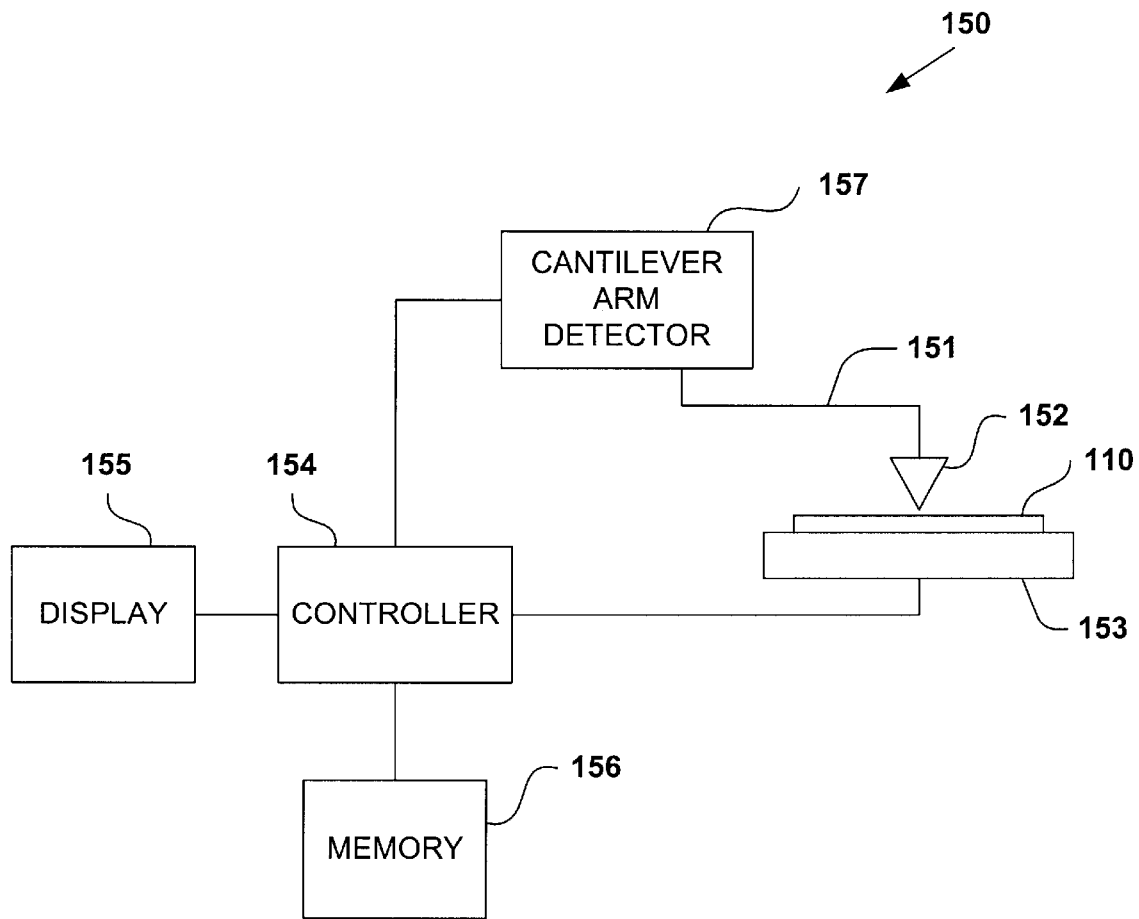
FIG. 10 is a block diagram of a charge or Hall voltage detection system according to the present invention.

As is well known by those skilled in the art, an AFM 150, as illustrated in FIG. 10, includes a microminiature cantilever arm 151 and a sharp tip 152 which makes contact with the wafer surface 110. The wafer 110 is placed on a scanning stage 153 which operates to move the wafer 110 with respect to the probe tip 152 to effectively scan the wafer surface 110. The stage 153 may incorporate traditional movement or actuation means (not shown) and may also include piezoelectric actuators for effectuating high precision movement of the stage 153 to provide high resolution scanning. Alternatively, the stage 153 may be kept stationary while similar actuation means may be used to move the cantilever arm 151/probe tip 152 assembly. Regardless of which component is moved relative to the other, the AFM scanning mechanism 150 is controlled by a programmable controller 154 which is operable to receive and analyze detected characteristics such as the accumulated charge and display the collected information to the user via a display 155 and store the data in a memory 156.

The AFM tip 152 may be used to detect the charge profile in various ways. In one example, the AFM tip 152 detects the accumulated charge in the following manner. As opposed to a contacting mode of operation in which the probe tip 152 rides on the surface 110 of the material to be measured to profile the surface topology, the AFM 150 is operated in a non-contacting mode. In the non-contacting mode, the AFM tip 152 is held a short distance from the wafer surface 110 (about 5 Angstroms to 500 Angstroms) and the tip 152 is deflected by electrostatic forces exerted against the tip 152 by the accumulated charge on the wafer surface 110. According to one exemplary embodiment of the present invention, the accumulated charge at a point on the surface 110 is proportional to the electrostatic force exerted on the AFM tip 152 which thus proportionally impacts the amount of deflection of the AFM tip 152. The amount of cantilever arm 151 deflection is preferably measured using precisely aligned optical components and a deflection measurement circuit (shown collectively as a cantilever arm detector 157 in FIG. 8), although other techniques may be used and are contemplated as falling within the scope of the present invention.

In another example, electric force microscopy (EFM) may be utilized. EFM may be performed in two ways: (1) electric field imaging, and (2) surface potential detection. In electric field imaging, variations in the electric field caused by the accumulated charge are detected by vibrating the cantilever arm and tip near its resonant frequency. Changes in the frequency due to the electric field gradient caused by the charge profile are then detected and used to determine the amount of accumulated charge. In surface potential detection, an oscillating voltage is applied to the tip which creates an oscillating electrostatic force. Since the force on the cantilever depends on the product of the AC drive voltage and DC voltage difference between the tip and the sample, the DC voltage at the tip is varied and when the cantilever no longer experiences an oscillating force, the tip and the sample are at the same DC voltage, thus determining the amount of charge at that point on the sample.

Figure 12:
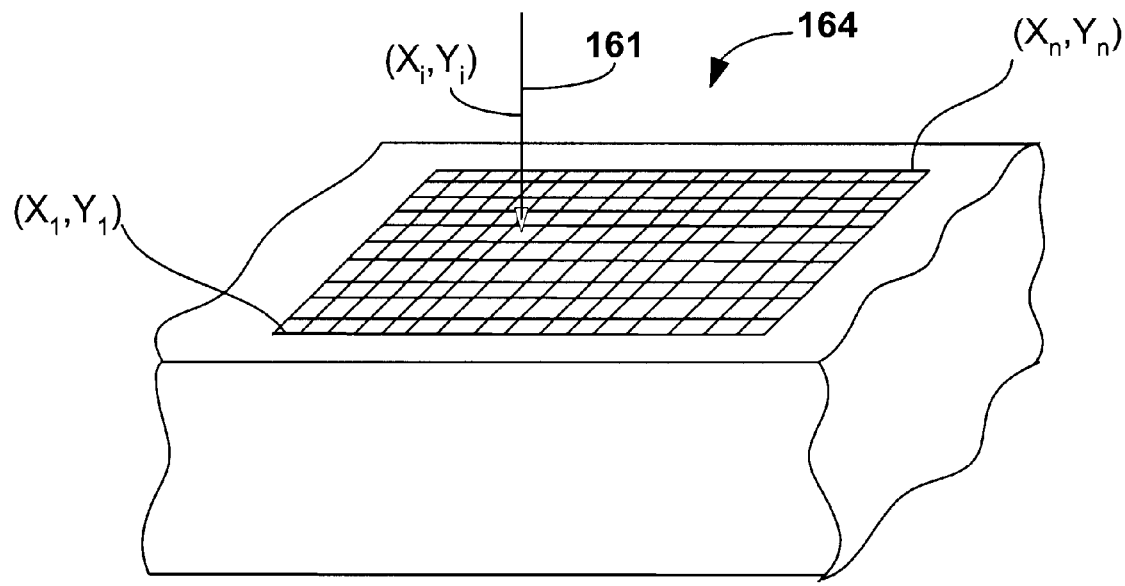
FIG. 12 is a fragmentary perspective view of the wafer illustrating the scanning of the surface using a charge detector to determine the doping concentration at each point on the wafer surface according to the present invention.
Figure 11:
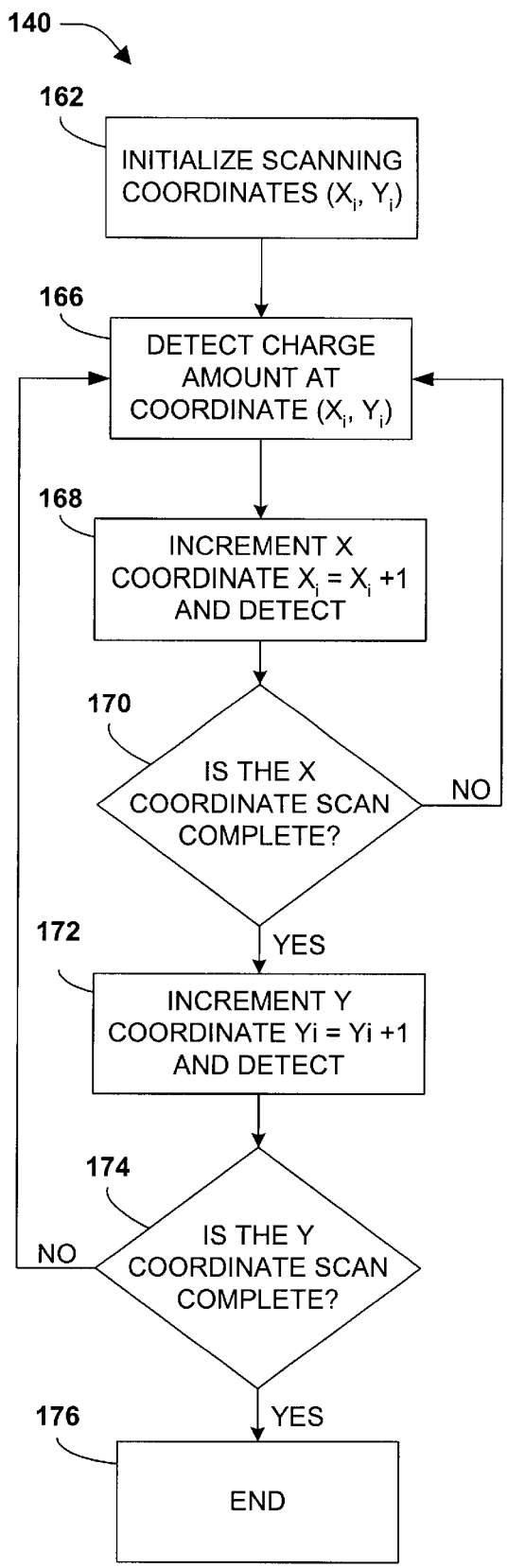
FIG. 11 is a flow chart diagram illustrating a method for detecting the accumulated charge profile on a surface of the material by scanning the surface and detecting the charge or Hall voltage at each point according to the present invention.

An exemplary method 140 of detecting the charge profile includes scanning the wafer surface 110 with a charge detector 161 such as an AFM, as illustrated in the flow chart of FIG. 11, which will be discussed in conjunction with FIG. 12. Under the control of a microcontroller, the detector 161 initializes the scanning coordinates at step 162 so that the detection scheme begins at a first coordinate $(X_1, Y_1)$. Although not shown in FIG. 12 for the sake of simplicity, the probes 106 and 108 (shown in FIG. 6) are placed across a square of the grid which corresponds to the detector 161 so that each square of the grid will experience a uniform, constant current in the region being detected. Preferably, the first coordinate $(X_1, Y_1)$ is at a corner of a square grid 164, as illustrated in FIG. 10, and the grid 164 is scanned by the detector 161 row by row. Alternatively, any method of scanning some or all of the points on the grid 164 may be used and each is contemplated as falling within the scope of the present invention.

Once the detector 161 is at the coordinate $(X_1, Y_1)$, the detector 161 detects the charge polarity and the charge amount at that point at step 166 by detecting the voltage at that point by, for example, detecting the amount of deflection (or alternatively a change in the resonant frequency) of the AFM tip 152 due to the electrostatic force exerted by the accumulated charge as discussed above. After the charge polarity and the charge amount is detected at step 166, the detector 161 is moved to the next coordinate (e.g., $X_2, Y_1$) at step 168 and the charge polarity and the charge amount at that point is detected. The detector 161 continues scanning and detecting in the "x" direction until the "x" coordinate scan is complete at step 170 (YES), which indicates that the detector 161 has completed a row scan. The detector 161 then moves its position incrementally in the "y" direction at step 172 to start scanning a new row (e.g., $X_i, Y_2$). The method 140 checks to see whether the grid scan is complete at step 174 by checking whether all the rows have been scanned. According to the present example, all the rows have not yet been scanned (NO), and the method 140 returns to step 166 to scan the row in the "x" direction. Once all the rows have been scanned (YES at step 174), the method 140 for detecting the charge profile on the wafer surface 110 is completed at step 176.

Returning now to FIG. 5, once the charge profile on the wafer surface 110 has been detected at step 140, the method 100 uses the detected charge profile to determine the doping type and the doping level concentration at one or more of the detected points at step 180. According to the present invention, the doping level is calculated using the detected charge profile (i.e., the measured Hall voltages) in the following manner using the variable references of FIG. 9.

To determine the carrier concentration (n) at a point $(X_j, Y_j)$ on the wafer surface 110, the following relationship is used:

$$E_Z = V_X B_Y,$$

which represents the equilibrium condition after the magnetic field is applied, wherein $E_z$ is the electric field formed by the charge accumulation due to the magnetic field, $B_y$ is the applied magnetic field strength, and $V_x$ is the carrier velocity which is often called the Hall coefficient ($R_H$) and is equal to Jn/qn. With respect to the Hall coefficient, $R_H$=Jn/qn, Jn is the current (i), q is the electric charge and n is the carrier concentration. Since the detected Hall voltage $V_z$ illustrated in FIG. 9 is directly related to the resultant electric field $E_z$, the carrier concentration (n) is inversely proportional to the detected Hall voltage and thus can be easily determined. In the above manner, the detected charge corresponding to the Hall voltage at each point on the wafer surface 110 can be used to determine the doping level concentration within the wafer.

In addition to detecting the doping level concentration via the Hall coefficient as discussed above, the doping type (e.g., whether a p-type or an n-type region) may be determined using the accumulated charge profile. As discussed supra in conjunction with FIG. 9, the Hall effect is caused by the deflection of moving carriers in the presence of a magnetic field oriented perpendicular to the direction of the moving carriers. Since majority carriers in a p-type region are holes (i.e., positive charge carriers) and the majority carriers in the n-type region are electrons (i.e., negative charge carriers) the polarity of the accumulated charge at the surface will differ for p-type and n-type regions. Consequently, when the charge accumulation profile is detected at step 140 of FIG. 5, the polarity of the charge (i.e., positive or negative) is used to determine the dopant type.

In another embodiment of the present invention, the plurality of detected charge accumulation profiles may be utilized to determine the location of defects within the processed semiconductor material. Since defects decrease the number of available charge carriers at or near the defect location, the defect results in a discontinuity in the expected continuous charge accumulation profile. Thus the charge accumulation profile may be analyzed individually and compared together to determine the location of defects within doped regions.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method of determining a doping type and a doping concentration of a processed semiconductor material, comprising the steps of:

moving carriers in the material, wherein a number of carriers is a function of the doping concentration of the material and a type of carriers is a function of the doping type of the material;

deflecting the carriers toward a surface of the material; and detecting an accumulated charge on the surface of the material due to the deflected carriers.

2. The method of claim 1, wherein moving carriers comprises forcing a current in the material.

3. The method of claim 1, further comprising determining the doping type based on a polarity of the accumulated charge.

4. The method of claim 1, wherein detecting an accumulated charge comprises:
   (a) initializing a scanning coordinate of a detection apparatus;
   (b) detecting a charge amount at a first point on the material surface;
   (c) moving the detection apparatus to another point on the material surface;
   (d) detecting the charge amount at the other point; and
   (e) repeating steps (c) and (d) until the surface of the material is substantially scanned and an accumulated charge profile is detected.

5. The method of claim 1, wherein detecting an accumulated charge comprises:
   (a) initializing a scanning coordinate for a charge detector;
   (b) scanning a first row in a first direction and detecting the accumulated charge at a plurality of points in the first row with the charge detector;
   (c) moving the charge detector in a direction perpendicular to the first row to a next row;
   (d) scanning the next row in the first direction and detecting the accumulated charge at a plurality of points in the next row with the charge detector;
   (e) repeating steps (c) and (d) until the surface of the material is substantially scanned and an accumulated charge profile is detected.

6. The method of claim 1, wherein detecting an accumulated charge comprises:
   (a) initializing a scanning coordinate for an atomic force microscope tip;
   (b) placing the atomic force microscope tip at the initialized coordinate near the surface;
   (c) detecting a charge amount at the initialized point on the material surface;
   (d) moving the atomic microscope tip in a first direction to another point near the material surface;
   (e) detecting the charge amount at the other point;
   (f) repeating steps (d) and (e) until the atomic force microscope tip has scanned a predetermined number of points in the first direction, thereby scanning a row;
   (g) moving the tip in a second direction substantially perpendicular to the first direction to another row;
   (h) detecting a charge amount at the point of the atomic force microscope tip location;
   (i) repeating steps (d) and (e) until the atomic force microscope tip has scanned the predetermined number of points in the first direction, thereby scanning another row; and
   (j) repeating steps (g), (h) and (i) until the atomic force microscope has scanned substantially the entire surface of the material.

7. The method of claim 1, further comprising calculating the doping concentration at a point on the material surface using the detected accumulated charge at the point on the material surface.

8. The method of claim 7, further comprising:
   scanning the surface of the material; and
   calculating the doping concentration at each point on the scanned material surface using the detected accumulated charge at each respective point on the material surface.

9. The method of claim 1, wherein deflecting the carriers comprises subjecting the material to a magnetic field.

10. The method of claim 9, wherein a direction of the magnetic field is perpendicular to a direction of flow of the carriers, wherein the magnetic field exerts a force on the carriers due to a Hall effect.

11. The method of claim 9, wherein the magnetic field comprises a generally static magnetic field.

12. The method of claim 1, wherein detecting the accumulated charge on the material surface comprises:
    placing a probe at a point near the material surface; and
    measuring a voltage at the point.

13. The method of claim 12, wherein the probe is an atomic force microscope tip.

14. The method of claim 13, wherein measuring the voltage with the tip comprises detecting an amount of deflection of the tip due to an electrostatic force exerted on the tip by the accumulated charge.

15. The method of claim 13, wherein measuring the voltage with the tip comprises detecting an amount of variation in a vibrating frequency of the tip due to an electrostatic force exerted on the tip by the accumulated charge.

* * * * *